United States Patent
McClean et al.

(10) Patent No.: US 12,132,290 B2
(45) Date of Patent: Oct. 29, 2024

(54) FIBER AMPLIFIER HAVING DUAL OUTPUT LASER DIODE

(71) Applicant: II-VI Delaware, Inc, Wilmington, DE (US)

(72) Inventors: Ian Peter McClean, Brixham (GB); Nadhum Kadhum Zayer, Devon (GB); Martin Richard Williams, Big Flats, NY (US)

(73) Assignee: II-VI DELAWARE, INC., Wilmington, DE (US)

( * ) Notice: Subject to any disclaimer, the term of this patent is extended or adjusted under 35 U.S.C. 154(b) by 691 days.

(21) Appl. No.: 17/246,666

(22) Filed: May 2, 2021

(65) Prior Publication Data

US 2022/0052503 A1 Feb. 17, 2022

Related U.S. Application Data (63) Continuation-in-part of application No. 16/947,643, filed on Aug. 11, 2020, now Pat. No. 11,652,332.

(51) Int. Cl.
*H01S 3/094* (2006.01)
*H01S 3/067* (2006.01)
*H01S 3/0941* (2006.01)
*H01S 3/16* (2006.01)
*H01S 5/028* (2006.01)

(52) U.S. Cl.
CPC .... *H01S 3/094003* (2013.01); *H01S 3/06716* (2013.01); *H01S 3/0675* (2013.01); *H01S 3/06766* (2013.01); *H01S 3/0941* (2013.01); *H01S 3/1608* (2013.01); *H01S 5/0287* (2013.01)

(58) Field of Classification Search
None
See application file for complete search history.

(56) References Cited

U.S. PATENT DOCUMENTS

| | | | |
|---|---|---|---|
| 4,468,772 A | 8/1984 | Oudar | |
| 4,932,034 A | 6/1990 | Usami et al. | |
| 5,224,116 A | 6/1993 | Whitley et al. | |
| 5,369,524 A * | 11/1994 | Pocholle | H01S 3/06708 359/345 |

(Continued)

FOREIGN PATENT DOCUMENTS

| | | | | |
|---|---|---|---|---|
| WO | WO-9318561 A1 * | 9/1993 | ....... | H01S 3/094003 |
| WO | WO-03084006 A2 * | 10/2003 | ............. | H01S 5/146 |

OTHER PUBLICATIONS

Communication Components, 980nm Pump Lasers—Dual Chip, website: <https://optical.communications.ii-vi.com/node/4723> II-VI Incorporated, retrieved Aug. 13, 2020.

*Primary Examiner* — Eric L Bolda
(74) *Attorney, Agent, or Firm* — Blank Rome LLP (57) ABSTRACT

A dual output laser diode may include first and second end facets and an active section. The first and second end facets have low reflectivity. The active section is positioned between the first end facet and the second end facet. The active section is configured to generate light that propagates toward each of the first and second end facets. The first end facet is configured to transmit a majority of the light that reaches the first end facet through the first end facet. The second end facet is configured to transmit a majority of the light that reaches the second end facet through the second end facet.

20 Claims, 7 Drawing Sheets

(56) References Cited

U.S. PATENT DOCUMENTS

| | | | | |
|---|---|---|---|---|
| 5,991,070 | A | * | 11/1999 | Zanoni .............. H01S 3/094003 |
| | | | | 359/345 |
| 6,330,264 | B1 | * | 12/2001 | Kussmaul ........... H01S 3/06766 |
| | | | | 372/75 |
| 9,503,181 | B2 | | 11/2016 | McClean et al. |
| 9,590,390 | B1 | * | 3/2017 | Tatah ..................... G11B 5/314 |
| 10,320,151 | B1 | * | 6/2019 | Traverso ............... H01S 5/1203 |
| 2003/0156617 | A1 | * | 8/2003 | Baney .................... H01S 5/146 |
| | | | | 372/96 |
| 2005/0243882 | A1 | * | 11/2005 | He ......................... H01S 5/026 |
| | | | | 372/50.1 |
| 2006/0239321 | A1 | * | 10/2006 | Kume .................. H01S 5/4031 |
| | | | | 372/50.122 |
| 2009/0310634 | A1 | * | 12/2009 | Mohrdiek ............... H01S 5/141 |
| | | | | 372/29.022 |
| 2015/0333472 | A1 | * | 11/2015 | Demir ................ H01S 5/02315 |
| | | | | 372/27 |

\* cited by examiner

FIBER AMPLIFIER HAVING DUAL OUTPUT LASER DIODE

CROSS-REFERENCE TO RELATED APPLICATIONS

This is a continuation-in-part of U.S. application Ser. No. 16/947,643 filed Aug. 11, 2020 (150287-03106), which is incorporated herein by reference.

FIELD

The embodiments discussed herein relate to a dual output laser diode.

BACKGROUND

Unless otherwise indicated in the present disclosure, the materials described in the present disclosure are not prior art to the claims in the present application and are not admitted to be prior art by inclusion in this section.

Doped fiber amplifiers generally operate by energizing ions in a doped fiber with pump light from a pump laser diode. An optical signal at a different wavelength than the pump light is transmitted through the doped fiber. Photons of the optical signal interact with the energized ions, causing the ions to give up some of their energy in the form of photons at the same wavelength as the photons of the optical signal, with the ions returning to a lower energy state. The optical signal is thereby amplified as it passes through the doped fiber.

The subject matter claimed in the present disclosure is not limited to implementations that solve any disadvantages or that operate only in environments such as those described above. Rather, this background is only provided to illustrate one example technology area where some implementations described in the present disclosure may be practiced.

SUMMARY

A fiber amplifier disclosed herein is operable with at least one electric drive signal for amplifying signal light on an optical path. The signal light has a signal wavelength. The fiber amplifier comprises a laser diode and at least one doped fiber. The laser diode has an active section positioned between end facets and is configured to generate first and second pump light that propagates respectively toward the facets in response to injection of the electrical drive signal into the active section. The first and second pump light having at least one pump wavelength different from the signal wavelength. The at least one doped fiber is disposed on the optical path and is doped with an active dopant. The at least one doped fiber has the signal light and at least a portion of the first and second pump light propagated therethrough. With the at least one pump wavelength of the first and second pump light configured to interact with the active dopant of the at least one doped fiber, the signal light is amplified.

Separate doped fibers on separate optical paths can receive the first and second pump light respectively from a dual output laser diode of the present disclosure. This design can reduce the number of required elements (i.e., the number of laser diode chips) needed for a fiber amplifier and can simplify the packaging.

Alternative designs that are even more compact can use a dual output laser diode of the present disclosure. For example, first and second doped fibers on the same optical path can receive the first and second pump light respectively—the first doped fiber having the first pump light counter-propagated therethrough, and the second doped fiber on the same optical path having the second pump light co-propagated therethrough. In yet another alternative, the same doped fiber can have the first and second pump light co-propagated and counter-propagated therethrough, respectively.

A method also disclosed herein is used with signal light having a signal wavelength. The method comprises: passing the signal light through at least one doped fiber disposed on an optical path and being doped with an active dopant; injecting an electrical drive signal into an active section of a dual output laser diode, the active section positioned between first and second end facets of the dual output laser diode; generating first and second pump light that propagates respectively toward the first and second end facets in response to the injection of the electrical drive signal into the active section, the first and second pump light having at least one pump wavelength different from the signal wavelength; and amplifying the signal light by: (i) propagating the first pump light from the first end facet relative to the signal light passing through the at least one doped fiber and interacting the first pump light with the at least one doped fiber; and (ii) propagating the second pump light from the second end facet relative to the signal light passing through the at least one doped fiber and interacting the second pump light with the at least one doped fiber.

The foregoing summary is not intended to summarize each potential embodiment or every aspect of the present disclosure.

DETAILED DESCRIPTION

Embodiments described herein relate to a dual output laser diode that generally includes an active section positioned between two end facets, each of which has low reflectivity. For example, each of the end facets may have an anti-reflection (AR) coating. In comparison, other laser diodes typically include an AR coating on only one end facet with a high reflectivity (HR) coating on the other end facet to direct substantially all light generated in the laser diode through the end facet with the AR coating.

Example dual output laser diodes described herein may be implemented with fiber amplifier systems such as erbium-doped fiber amplifier (EDFA) systems or other systems. Some fiber amplifier systems pump multiple doped fibers with pump light from a single laser diode. In particular, the pump light may be split into multiple paths using one or more optical components external to the laser diode. Splitting the pump light externally to the laser diode may result in pump instability due to coherent interactions and other effects.

According to embodiments described herein, the pump light is effectively split internally in the laser diode, e.g., by configuring each end facet with a low reflectivity such that some pump light exits each end facet and may be directed into a corresponding path. This arrangement may avoid or at least reduce pump instability due to coherent interactions and other effects that may arise when the pump light is output from one end facet of the laser diode and is split externally to the laser diode.

In addition, this arrangement may decrease a maximum optical power density within the laser diode by a factor of about two since no pump light or relatively little pump light is reflected at one end facet back to the other as occurs in, e.g., laser diodes with an AR coating at one end facet and an HR coating at the other. The reduced maximum optical power density of laser diodes according to embodiments described herein relative to laser diodes with AR and HR coatings at opposite end facets may increase reliability.

In an embodiment, the dual output laser diode may output equal or about equal pump light power from the end facets.

In an embodiment, the dual output laser diode may output unequal pump light power from the end facets. Unequal pump light power may be achieved with AR coatings of unequal reflectivity at the end facets, such as a first AR coating with a reflectivity of 1% at a first end facet and a second AR coating with a reflectivity of 0.75% at a second end facet. Alternatively or additionally, unequal pump light power at the end facets may be achieved by structuring a waveguide of the laser diode to have different transmissivities at or near the two end facets, such as a transmissivity of 99.5% for a portion of the waveguide near the first end facet and a transmissivity of 99% for a portion of the waveguide near the second end facet.

Alternatively or additionally, unequal pump light power at the end facets may be achieved by independently controlling first and second portions of the dual output laser diode. In this and other embodiments, the dual output laser diode may include a first anode and cathode electrically coupled to the first portion of the laser diode and a second anode and cathode electrically coupled to the second portion of the laser diode. An etched mirror, a distributed feedback (DFB) mirror, or other reflective structure may be formed in the laser diode between the first and second portions to optically isolate the first and second portions from each other. Accordingly, the first portion of the laser diode and the second portion of the laser diode may be independently operated while being integrally formed in a single structure.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1A:
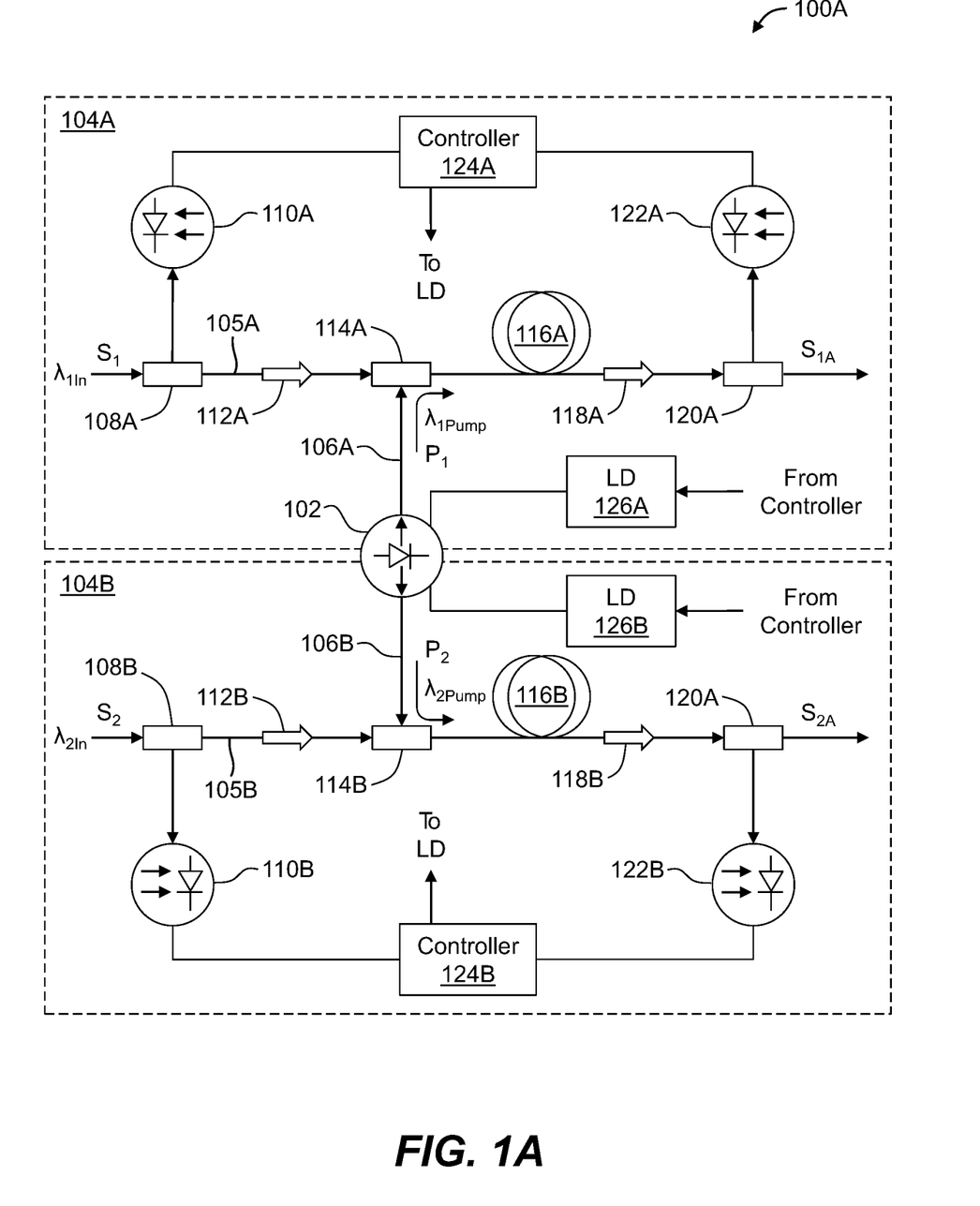
FIG. 1A illustrates an example dual fiber amplifier system that includes a dual output laser diode.

FIG. 1A illustrates an example dual fiber amplifier system 100A (hereinafter "system 100A") that includes a dual output laser diode 102 (hereinafter "laser 102"), arranged in accordance with at least one embodiment described herein.

The system 100A may further include first and second fiber amplifiers 104A-B (collectively "fiber amplifiers 104" or generically "fiber amplifier 104"). The fiber amplifiers 104 include respective pump paths 106A-B (collectively "pump paths 106" or generically "pump path 106") that may include optical fibers or other suitable waveguides to convey pump light from the laser 102 into the corresponding one of the fiber amplifiers 104. When implemented as optical fibers, the pump paths 106 may be referred to as pump input optical fibers.

In general, the laser 102 may include two end facets and may be configured to output pump light from each of the two end facets into a corresponding one of pump paths 106. For example, a portion, e.g., some or most, of the pump light that reaches each end facet may be transmitted through the end facet and a corresponding pump input optical fiber of the pump paths 106 may be positioned to receive the portion of the pump light that passes through the corresponding end facet. Configuring the laser 102 to output pump light from both end facets may eliminate the need for any components external to the laser 102 to split pump light as required for laser diodes that have a HR coating at one end facet with pump light output only from the other end facet.

Each fiber amplifier 104A-B may include an optical path 105A-B having a first optical isolator 112A-B (hereinafter collectively "first isolators 112" or generically "first isolator 112"), a beam combiner 114A-B (hereinafter collectively "combiners 114" or generically "combiner 114"), a doped fiber 116A-B (hereinafter collectively "doped fibers 116" or generically "doped fiber 116"), a second optical isolator 118A-B (hereinafter collectively "second isolators 118" or generically "second isolator 118"). As will be appreciated, the optical paths 105A-B may include optical fibers or other suitable waveguides to convey signal light from an input to an output of the system 100A. The optical isolators 118A-B can be Faraday isolators.

Moreover, to monitor and control operation, each amplifier 104AB may include an input optical tap 108A-B (hereinafter collectively "input taps 108" or generically "input tap 108"), an input photodiode 110A-B (hereinafter collectively "input photodiodes 110" or generically "input photodiode 110"), an output optical tap 120A-B (hereinafter collectively "output taps 120" or generically "output tap 120"), and an output photodiode 122A-B (hereinafter collectively "output photodiodes 122" or generically "output photodiode 122"). In general, each fiber amplifier 104A-B is configured to receive an optical signal $S_1$ or $S_2$ as input, which may be portions of the same signal or may be different signals as the case may be. Each fiber amplifier 104A-B is then configured to output an amplified signal $S_{1A}$ or $S_{2A}$, which is an amplified version of the optical signal $S_1$ or $S_2$ respectively.

In more detail, the optical signal $S_1$ or $S_2$ is received at the input tap 108 on the optical path 105 and a small portion thereof (e.g., 2%) is directed by the input tap 108 to the input photodiode 110 to, e.g., measure optical power of the optical signal $S_1$ or $S_2$. A remainder (e.g., 98%) of each of the optical signals $S_1$ or $S_2$ passes through the input tap 108 and the first isolator 112 to the combiner 114. The first isolator 112 may be configured to prevent or at least reduce back reflection from the combiner 114. The combiner 114 combines the optical signal $S_1$ or $S_2$ with the pump light received from the laser 102 via the pump path 106.

Each optical signal $S_1$ or $S_2$ has a wavelength $\lambda_{1In}$ or $\lambda_{2In}$. The values of $\lambda_{1In}$ and $\lambda_{2In}$ may be the same or different. The pump light received at the combiner 114 has a wavelength $\lambda_{1Pump}$ or $\lambda_{2Pump}$. The values of $\lambda_{1Pump}$ and $\lambda_{2Pump}$ may be the same or different. Further, the values of $\lambda_{1Pump}$ and $\lambda_{2Pump}$ are selected to provide optical amplification to the corresponding optical signal $S_1$ or $S_2$ operating at $\lambda_{1In}$ or $\lambda_{2In}$ in the presence of a specific rare-earth dopant within the doped fiber 116. The dopant may be erbium, ytterbium, or other dopant. When the dopant is erbium, the wavelength $\lambda_{1Pump}$ or $\lambda_{2Pump}$ of the pump light emitted by the laser 102 may be about 980 nanometers (nm) (e.g., 970 nm to 990 nm), such as a wavelength of 972 nm, 974 nm, 976 nm, or 978 nm. In some embodiments, pump light at the wavelengths $\lambda_{1Pump}$ or $\lambda_{2Pump}$ of about 980 nanometers may be configured to provide amplification in the doped fiber 116 to the optical signals $S_1$ or $S_2$ when the wavelengths $\lambda_{1In}$ or $\lambda_{2In}$ of the optical signals $S_1$ and $S_2$ are about 1550 nm, such as wavelengths in the C band (~1525 nm to 1570 nm), or about 1590 nm, such as wavelengths in the L band (~1570 nm to 1625 nm).

The combiner 114 outputs the optical signal $S_1$ or $S_2$ combined with the pump light to the doped fiber 116. The pump light at wavelength $\lambda_{1Pump}$ or $\lambda_{2Pump}$ energizes ions in the doped fiber 116 and the optical signal $S_1$ or $S_2$ at wavelength $\lambda_{1In}$ or $\lambda_{2In}$ interacts with the energized ions. In particular, photons of the optical signal $S_1$ or $S_2$ at the wavelength $\lambda_{1In}$ or $\lambda_{2In}$ stimulate emission of photons from the energized ions at the wavelength $\lambda_{1In}$ or $\lambda_{2In}$ to generate the amplified signal $S_{1A}$ or $S_{2A}$.

The amplified signal $S_{1A}$ or $S_{2A}$ passes through the second isolator 118 to the output tap 120. The output tap 120 directs a small portion of the amplified signal $S_{1A}$ or $S_{2A}$ to the output photodiode to, e.g., measure optical power of the amplified signal $S_{1A}$ or $S_{2A}$. The remainder of the amplified signal $S_{1A}$ or $S_{2A}$ passes through the output tap 120 and is output from the fiber amplifier 104.

The system 100A may additionally include one or more controllers 124A-B (hereinafter collectively "controllers 124" or generically "controller 124") and one or more laser drivers 126A-B (hereinafter collectively "laser drivers 126" or generically "laser driver 126") ("LD" in FIG. 1A). The controller 124 may be communicatively coupled to the input photodiode 110 and the output photodiode 122. The laser driver 126 may be communicatively coupled to the controller 124 and the laser 102. The laser driver 126 is generally configured to apply an electrical drive signal to the laser 102 as directed by the controller 124. Optical power of the pump light emitted by the laser 102 may be determined by the electrical drive signal. For example, the laser 102 may emit pump light with an optical power that is proportional to or has some other known relationship to current of the electrical drive signal.

The controller 124 may compare the optical power of the optical signal $S_1$ or $S_2$, e.g., as measured by the input photodiode 110, to the optical power of the amplified signal $S_{1A}$ or $S_{2A}$, e.g., as measured by the output photodiode 122, to determine gain of the fiber amplifier 104. If the gain is above or below a target gain, the laser driver 126 may adjust the electrical drive signal to increase or decrease the gain of the fiber amplifier 104. In some embodiments described herein, the laser 102 includes two portions that may be independently controlled by a corresponding one of the laser drivers 126 to independently control gain in the fiber amplifiers 104.

FIG. 1A illustrates an example in which the optical power of the pump light from the two end facets of the laser 102 is independently controlled, e.g., by providing independent electrical drive signals from independent laser drivers 126 to independent portions of the laser 102. In other embodiments, the optical power of the pump light from the two end facets may not be independent from the other. In these and other embodiments, the system 100A may have a single controller 124 and a single laser driver 126 rather than two controllers 124 and two laser drivers 126.

Figure 1B:
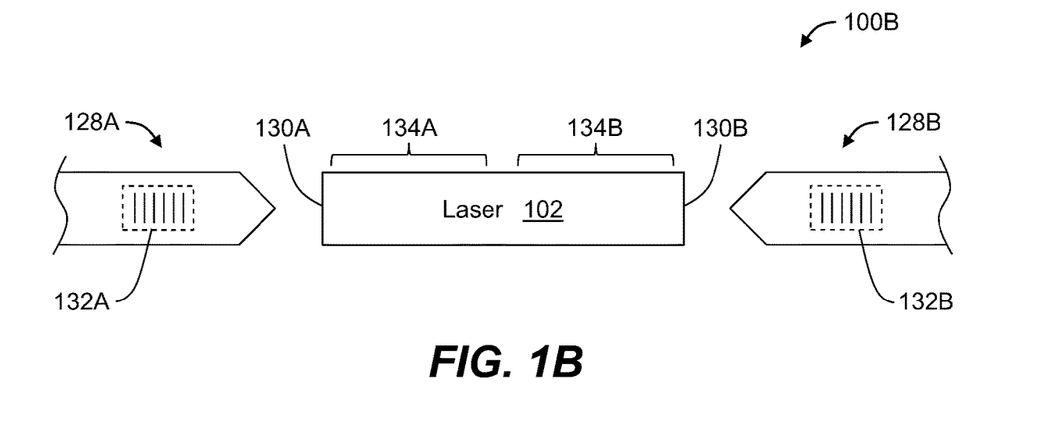
FIG. 1B illustrates a portion of the dual fiber amplifier system of FIG. 1A that includes the dual output laser diode and first and second pump input optical fibers.

FIG. 1B illustrates a portion 100B of the system 100A of FIG. 1A that includes the laser 102 and first and second pump input optical fibers 128A-B (hereinafter collectively "pump input optical fibers 128" or generically "pump input optical fiber 128"), arranged in accordance with at least one embodiment described herein. The pump input optical fibers 128 may include, be included in, or correspond to the pump paths 106 of FIG. 1A.

As illustrated in FIG. 1B, the laser 102 includes two end facets 130A, 130B (hereinafter collectively "end facets 130" or generically "end facet 130") spaced apart from each other. Each of the end facets 130 has low reflectivity, such as a reflectivity of 5%, 3%, or 1% or less. The reflectivity may be or include reflectivity for a single wavelength, multiple wavelengths, or across a range of wavelengths such as an operational wavelength range of the laser 102. The operational wavelength range may include wavelengths suitable for pump light, such as wavelengths of about 980 nm or other wavelengths. In some embodiments, the operational wavelength range may be from 970 nm to 990 nm, or from 975 nm to 985 nm, or other suitable range.

The pump input optical fibers 128 are positioned so that the corresponding end facet 130 is optically coupled to the corresponding pump input optical fiber 128. For example, the first end facet 130A is optically coupled to the first pump input optical fiber 128A and the second end facet 130B is optically coupled to the second pump input optical fiber 128B. In some embodiments, each pump input optical fiber 128 may be optically aligned to the corresponding end facet 130 and positioned sufficiently close to the corresponding end facet 130 that pump light output from the first end facet 130A is coupled into the pump input optical fiber 128. Alternatively or additionally, one or more optical elements, such as one or more lenses or other optical elements, may be positioned between the end facet 130 and the pump input optical fiber 128.

Each of the pump input optical fibers 128 may include a first or second fiber Bragg grating (FBG) 132A, 132B (hereinafter collectively "FBGs 132" or generically "FBG 132") formed therein. The FBGs 132 may be configured to reflect a portion, e.g., 2-4%, of the pump light back to the laser 102. Each FBG 132 may be configured to reflect back a predetermined wavelength or multiple predetermined wavelengths which may "lock" the laser 102 to the predetermined wavelength(s) such that the laser 102 exhibits stable lasing at the predetermined wavelength(s). The FBGs 132 may be configured to reflect back the same or different predetermined wavelength(s), to cause the laser 102 to emit pump light from the end facets 130 at the same or different predetermined wavelength(s).

For example, the first FBG 132A may be configured to reflect back a first wavelength of 974 nm. The reflected light may be coupled through the first end facet 130A into the laser 102 where it interacts generally with a first portion 134A of the laser 102 such that the first portion 134A of the laser 102 is locked to 974 nm.

The second FBG 132B may be configured to reflect back both the first wavelength of 974 nm and a second wavelength of 976 nm. The reflected light may be coupled through the second end facet 130B into the laser 102 where it interacts generally with a second portion 134B of the laser 102 such that the second portion 134B of the laser 102 is locked to both 974 nm and 976 nm.

More generally, each FBG 132 may lock the corresponding first or second portion 134A, 134B of the laser 102 to one or multiple predetermined wavelength(s).

In other embodiments, the laser 102 itself may include a DFB structure to lock the laser 102 to a predetermined wavelength(s) such that the FBGs 132 may be omitted.

In some embodiments, each of the FBGs 132 forms a fiber cavity with the laser 102, the FBGs 132 providing sufficient reflectivity to ensure lasing of the laser 102. Alternatively or additionally, the laser 102 may include a ridge structure as described with respect to FIG. 2. Roughness of the ridge structure, thermal induced refractive changes, or gain induced refractive changes along the length of the laser 102 may reflect and scatter light generated in the laser 102 sufficiently to build up the optical field and ensure lasing of the laser 102. In some embodiments, the laser 102 may have a higher threshold or gain for lasing than other lasers in view of the low reflectivity at the end facets 130.

As can be seen with reference to FIG. 1A, the fiber amplifier system 100A can use signal light having a first signal light portion $S_1$ with a first of the signal wavelength $\lambda_{1In}$ and having a second signal light portion $S_2$ with a second of the signal wavelength $\lambda_{2In}$. A first doped fiber 116A is in optical communication with the first signal light portion $S_1$ and is in optical communication with the first pump light $P_1$. Meanwhile, a second doped fiber 116B is in optical communication with the second signal light portion $S_2$ and is in optical communication with the second pump light $P_1$ Separate combiners 114A-B, which can be dichroic pump couplers, fused-fiber couplers, or other couplers, are configured to combine the signal light portions $S_{1-2}$ with the respective pump light $P_{1-2}$ from the end facets. The signal light portions may have the same or different signal wavelength $\lambda_{1-2In}$; and the pump light wavelengths $\lambda_{1-2Pump}$ may be the same or different; and the first and second pump light can be disposed in forward or revere optical communication with the respective doped fiber 116A-B.

Moreover, the dopant for the two doped fibers 116A-B can be the same or different. For instance, both fibers 116A-B can have the same dopant material, e.g., Erbium, but with different concentrations. As well, one of the fibers 116A-B can have a mix of a dopant material, e.g., a mix of Erbium in one loop, while the other of the fibers 116A-B can have a different mix, or the two fibers 116A-B may have completely different dopant materials. These and other variations can be used.

Figure 2:
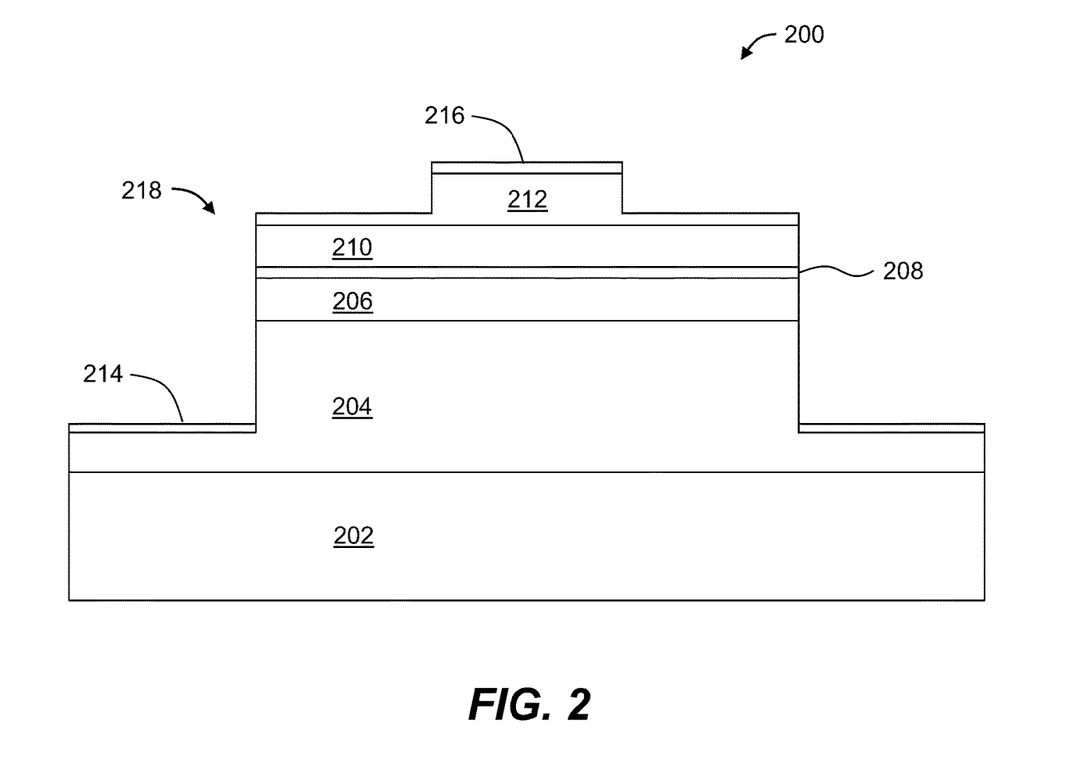
FIG. 2 is a cross-sectional view of an example dual output laser diode.

FIG. 2 is a cross-sectional view of an example dual output laser diode 200 (hereinafter "laser 200"), arranged in accordance with at least one embodiment described herein. The laser 200 may include, be included in, or correspond to the other lasers herein. The cross-sectional view of FIG. 2 is in a plane that is parallel to end facets of the laser 200 and perpendicular to a light emission direction of the laser 200. The light emission direction is in and out of the page in FIG. 2 and this direction is also referred to as a longitudinal direction.

As illustrated in FIG. 2, the laser 200 and laser diodes generally may include various epitaxial layers, such as a substrate 202, a lower cladding layer 204, a lower waveguide layer 206, an active layer 208, an upper waveguide layer 210, an upper cladding layer 212, a cathode 214, and an anode 216. The laser 200 may include additional or different layers or elements than illustrated in FIG. 2 in other embodiments. The end facets of the laser 200 may be formed in the epitaxial layers, e.g., by cleaving through the epitaxial layers.

The configuration of FIG. 2 includes the active layer 208 with multiple quantum wells (MQWs) embedded in the lower and upper waveguide layers 206, 210 and surrounded by lower and upper cladding layers 204, 212 that are configured to confine the optical mode in a transversal direction, e.g., vertically in FIG. 2.

The laser 200 includes a ridge structure 218 to confine the optical mode in a lateral direction, e.g., horizontally in FIG. 2. The ridge structure 218 with lower and upper waveguide layers 206, 210 and lower and upper cladding layers 204, 212 forms a waveguide that extends longitudinally, e.g., in and out of the page in FIG. 2, between end facets of the laser 200 and that is configured to guide light generated by the laser 200.

The active layer 208 may extend longitudinally for all or a portion of a length (e.g., in and out of the page in FIG. 2) of the laser 200. Alternatively or additionally, the anode 216 may extend longitudinally for all or a portion of the length of the laser 200 and the anode 216 may have a region in which current is injected, referred to as a current injection region, that may extend longitudinally for all or a portion of a length of the anode 216. A length of the current injection region may determine a longitudinal extent of stimulated emission of light within the laser 200. A portion of the laser 200 that extends longitudinally the length of the active layer 208, the length of the anode 216, or the length of the current injection region of the anode 216 may be referred to as an active section of the laser 200. The active section of the laser 200 may, but does not necessarily, extend longitudinally from one end facet to the other.

The cathode 214 and the anode 216 are electrically coupled to opposite sides of the active section. In the example of FIG. 2, the cathode 214 and the anode 216 are electrically coupled in particular to a bottom and top of the active section of the laser 200. A laser driver, such as the laser driver 126 of FIG. 1A, may be coupled to the anode 216 to inject an electrical drive signal into and through the laser 200 to the cathode 214. The electrical drive signal may cause electrons and holes to be injected from opposite sides into the active layer 208 where they recombine via stimulated emission to generate photons.

Figure 3:
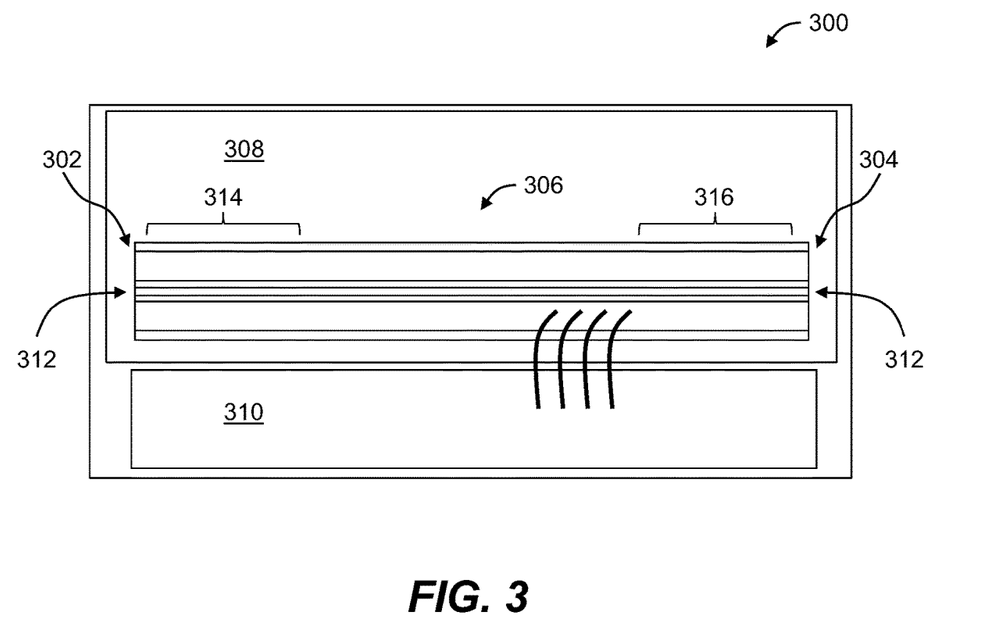
FIG. 3 is a top view of another example dual output laser diode.

FIG. 3 is a top view of another example dual output laser diode 300 (hereinafter "laser 300"), arranged in accordance with at least one embodiment described herein. The laser 300 may include, be included in, or correspond to the other lasers herein. As illustrated in FIG. 3, the laser 300 may include a first end facet 302, a second end facet 304, and an active section 306 positioned between the first end facet 302 and the second end facet 304.

In general, the active section 306 may be configured to generate light that propagates toward each of the first and second end facets 302, 304. The light may be generated by the active section 306 in response to injection of an electrical drive signal into the active section 306. The laser 300 may further include an anode 308 and a cathode 310 electrically coupled to opposite sides, e.g., a top and bottom, of the active section 306 to inject the electrical drive signal into the active section 306 between the anode 308 and the cathode 310.

Each of the first and second end facets 302, 304 may have low reflectivity. In an example, the low reflectivity at each of the first and second end facets 302, 304 is achieved by cleaving the laser 300 from a wafer of lasers 302 and forming an AR coating on the cleaved end facets.

In these and other embodiments, the first and second end facets 302, 304 may be configured to transmit a portion, such as a majority, of the light generated by the active section 306 that reaches the first or second end facet 302, 304 through the first or second end facet 302, 304. For example, the first or second end facet 302, 304 may be configured to transmit at least 95%, 97%, or 99% of the light generated by the active section 306 that reaches the first or second end facet 302, 304 through the first or second end facet 302, 304. In these and other embodiments, the first or second end facet 302, 304 may have a reflectivity less than 1%. The reflectivity may be or include reflectivity for a single wavelength, multiple wavelengths, or a range of wavelengths such as an operational wavelength range of the laser 300. The operational wavelength range of the laser 300 may be the same as or different than other operational wavelength ranges described herein.

In some embodiments, the reflectivity of the first end facet 302 is the same as the reflectivity of the second end facet 304. Accordingly, the optical power of light output from the first and second end facets 302, 304 may be the same or approximately the same.

In some embodiments, the reflectivity of the first end facet 302 is different than the reflectivity of the second end facet 304. Accordingly, the optical power of light output from the first end facet 302 may be different than the optical power of light output from the second end facet 304.

The active section 306 may include a waveguide 312 that extends between the first end facet 302 and the second end facet 304. The waveguide 312 may include the waveguide described with respect to FIG. 2 or other suitable waveguide. A first portion 314 of the waveguide 312 near the first end facet 302 may have a first transmissivity. A second portion 316 of the waveguide 312 near the second end facet 304 may have a second transmissivity. The first and second transmissivities may each be or include transmissivity for a single wavelength, multiple wavelengths, or a range of wavelengths such as the operational wavelength range of the laser 300. In these and other embodiments, the first and second transmissivities may be greater than 95%, 97%, or 99%.

The first and second transmissivities of the first and second portions 314, 316 of the waveguide 312 may be the same or different. The first and second transmissivities may depend on materials and structure of the first and second portions 314, 316 of the waveguide 312. Accordingly, the materials or structure of the first and second portions 314, 316 of the waveguide 312 may be selected to output light with equal or different optical power from the first and second end facets 302, 304, as desired.

Figure 4:
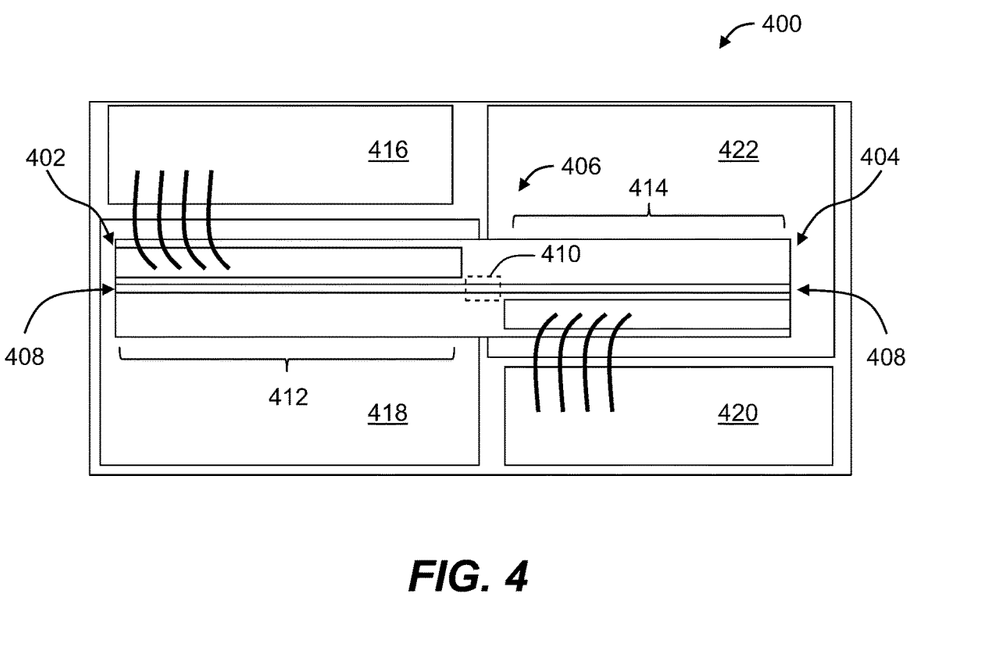
FIG. 4 is a top view of another example dual output laser diode, all arranged in accordance with at least one embodiment described herein.

FIG. 4 is a top view of another example dual output laser diode 400 (hereinafter "laser 300"), arranged in accordance with at least one embodiment described herein. The laser 400 may include, be included in, or correspond to the other lasers herein. As illustrated in FIG. 4, the laser 400 may include a first end facet 402, a second end facet 404, and an active section 406 positioned between the first end facet 402 and the second end facet 404. The laser 400 may additionally include a waveguide 408. The first and second end facets 402, 404, the active section 406, and the waveguide 408 may generally be configured and operated in the same or similar manner as the corresponding components in other lasers described herein.

The laser 400 may additionally include a reflective structure 410 formed in the active section 406 between first and second portions 412, 414 of the active section 406. The reflective structure 410 may be configured to optically isolate the first portion 412 of the active section 406 from the second portion 414 of the active section 406. The reflective structure 410 may include an etched mirror, a DFB structure, or other suitable structure formed in the active section 406. When implemented as a DFB structure, the reflective structure 410 may lock the laser 400 to a predetermined wavelength(s).

A placement of the reflective structure 410 within the active section 406 may be selected to divide the active section 406 into portions of equal or unequal length. For example, as illustrated in FIG. 4, the first portion 412 is longer than the second portion 414. In general, greater active section length leads to greater optical power output, all other parameters being equal. Accordingly, another option to provide unequal optical power at the end facets of a dual output laser diode, if desired, is to configure the dual output laser diode with an active section with two portions of unequal length as illustrated in FIG. 4.

The laser 400 may further include a first anode and cathode 416, 418 electrically coupled to the first portion 412 of the active section 406 and a second anode and cathode 420, 422 electrically coupled to the second portion 414 of the active section 406. In particular, the first anode and cathode 416, 418 may be electrically coupled to opposite sides (e.g., top and bottom) of the first portion 412 of the active section 406 and the second anode and cathode 420, 422 may be electrically coupled to opposite sides (e.g., top and bottom) of the second portion 414 of the active section 406. A first electrical drive signal may be injected through the first portion 412 via the first anode and cathode 416, 418 and a second electrical drive signal may be injected through the second portion 414 via the second anode and cathode 420, 422. Accordingly, while the first and second portions 412, 414 of the active section 406 are integrally formed in a single structure (e.g., an epitaxial structure of the laser 400), they may nevertheless be independently operated.

As disclosed above, a dual output laser diode of the present disclosure can provide first and second pump light respectively so separate doped fibers on separate optical paths. This design can reduce the number of required elements (i.e., the number of laser diode chips) needed and can simplify the packaging requirements for a fiber amplifier.

As disclosed below, additional designs that are even more compact can use a dual output laser diode of the present disclosure. These additional designs not only reduce the number of required elements (i.e., the number of laser diode chips) needed, but they too can simplify the packaging requirements for a fiber amplifier.

Figure 5A:
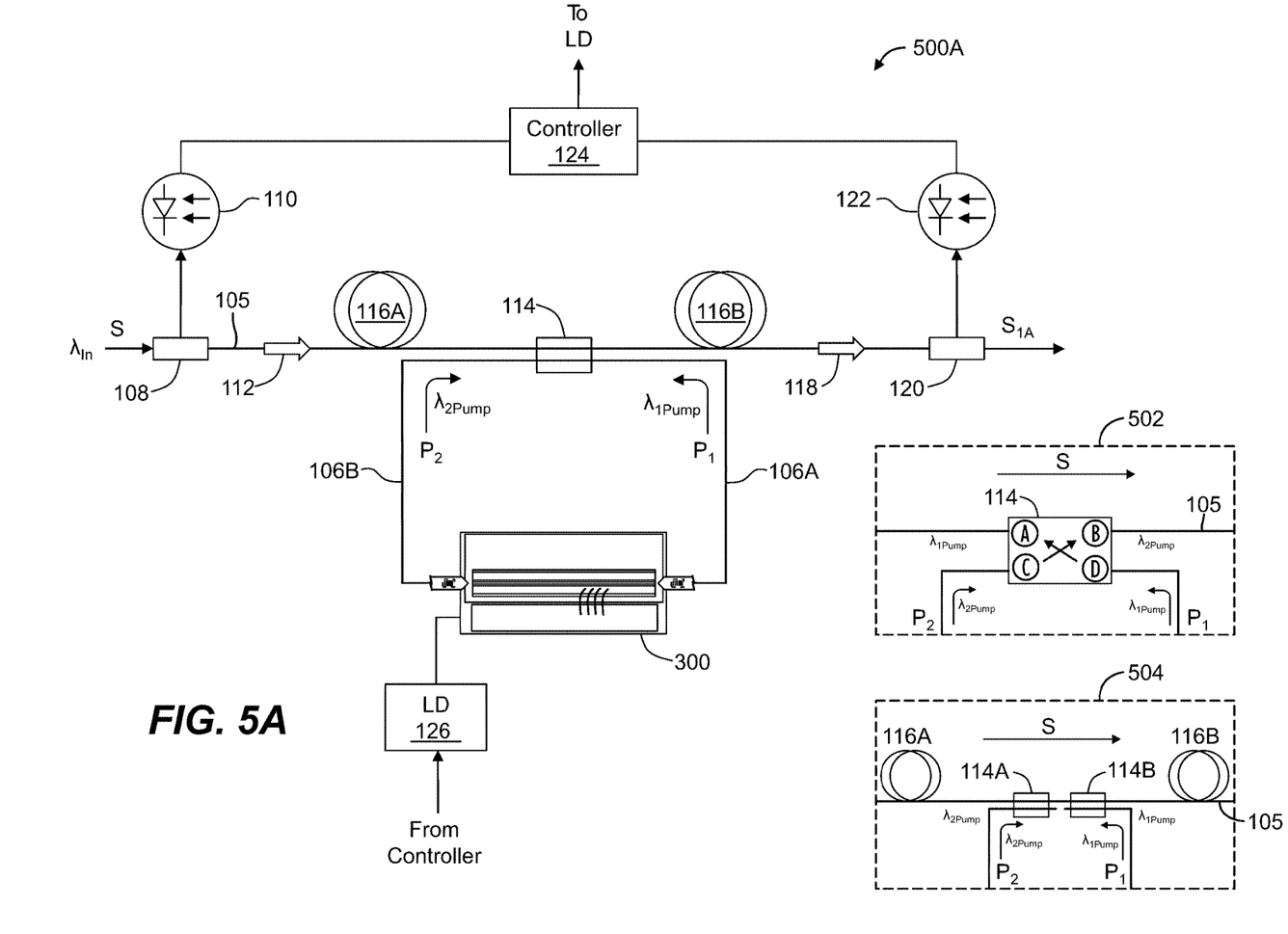
FIG. 5A illustrates a dual fiber amplifier system having a dual output laser diode pumping two doped fibers.

FIG. 5A illustrates a dual fiber amplifier system 500A having a dual output laser diode 300 that pumps two doped fibers 116A-B disposed on an optical path 105. (The same reference numbers are used for comparable elements disclosed in other figures.) On the optical path 105, the system 500A includes a first optical isolator 112, a first doped fiber 116A, at least one beam combiner 114, a second doped fiber 116B, and a second optical isolator 118. As will be appreciated, the optical path 105 may include optical fibers or other suitable waveguides to convey signal light from an input to an output of the system 500A.

As shown, the dual output laser diode 300 has respective pump paths 106A-B to the at least one combiner 114. The paths 106A-B may include optical fibers or other suitable waveguides to convey pump light $P_{1-2}$ from the laser diode 300 into a corresponding one of the doped fibers 116A-B. As shown, the at least one combiner 114 can be a shared combiner 114 used for both paths 106A-B.

As will be appreciated, the at least one combiner 114 may be based on a pump coupler that uses fused-fiber technology and is constructed as a four-port device, such as schematically shown in the detail 502. The signal light S at the signal wavelength (e.g., 1550 nm) coupled to ports A, B passes in the direction shown and can stay in the same path. However, light from a pump signal P at a pump wavelength (e.g., 980 nm) would cross to the other path. Normally, for example, one pump signal (e.g., $P_2$) is input at a port C, but the other port D does not have an input. The pump signal ($P_2$) would thereby be coupled from port C to port B. Here in the present arrangement, however, the one combiner 114 as a fiber-based coupler is capable of adding in both pump signals ($P_1$, $P_2$). One pump signal ($P_1$) can pass from port D to A, and the other pump signal ($P_2$) can pass from port C to B without the pump light being stripped out of the path between ports A and B.

Alternatively, as shown in the alternate detail 504 of FIG. 5A, each path 106A-B may include its own combiner 114A-B. If two conventional fused-fiber couplers were used for these combiners 114A-B, the pump signals ($P_1$, $P_2$) added to the optical path 105 would be stripped from the optical path 105 by the adjacent fused-fiber coupler. Therefore, rather than using fused-fiber couplers, these combiners 114A-B can use a thin film filter coupler. In this case, the pump signals ($P_1$, $P_2$) having the pump wavelengths $\lambda_{1-2Pump}$ would be reflected and directed as shown.

Other arrangements can be used. Moreover, the fiber amplifier 500A disclosed herein can be used as part of an amplifier chain in multiple stages. In general, the laser 300 may include the pump laser of FIG. 3 having the two end facets and configured to output pump light from each of the two end facets into a corresponding one of pump paths 106A-B.

Either way, the laser 300 pumps first pump light $P_1$ through the first path 106A and the at least one combiner 114 in a reverse configuration to the first doped fiber 116A, which is counter-propagated or backward-pumped. The laser 300 at the same time pumps second pump light $P_2$ through the second path 106B and the at least one combiner 114 in a forward configuration to the second doped fiber 116B, which is co-propagated or forward-pumped.

Arranged in a backward pumping direction, the first pump light $P_1$ counter-propagates with the primary signal light S through the first doped fiber 116A. Arranged in a reverse pumping direction, the second pump light $P_2$ co-propagates with the primary signal light S through the second doped fiber 116B.

In general, the doped fibers 116A-B can be the same or different; the optical power of the pump light $P_{1-2}$ can be the same or different; and the pump wavelengths $\lambda_{1-2Pump}$ can be the same or different, due to the versatility of the present configuration and to suite a particular implementation. Moreover, the dopant for the doped fibers 116A-B can be the same or different. For instance, both fibers 116A-B can have the same dopant material, e.g., Erbium, but with different concentrations. As well, one of the fibers 116A-B can have a mix of a dopant material, e.g., a mix of Erbium, while the other of the fibers 116A-B can have a different mix, or the two fibers 116A-B may have completely different dopant materials. These and other variations can be used.

As with other embodiments, the system 500A may also include an input optical tap 108, an input photodiode 110, an output optical tap 120, an output photodiode 122, and a controller 124 for controlling a laser driver 126 of the laser 300.

During operation, an optical signal S on the optical path 105 is received at the input tap 108, and a small portion thereof (e.g., 2%) can be directed by the input tap 108 to the input photodiode 110 to measure optical power of the optical signal S. A remainder (e.g., 98%) of the optical signal S passes through the input tap 108 and the first isolator 112 and then passes to the first doped fiber 116A, the at least one combiner 114, and the second doped fiber 116B. The first isolator 112 may be configured to prevent or at least reduce back reflection from the combiner 114.

In the backward pump configuration, the at least one combiner 114 combines the optical signal S with the pump light $P_1$ received from the laser 300 via the first pump path 106A. In the forward pump configuration, the at least one combiner 114 combines the optical signal S with the pump light $P_2$ received from the laser 300 via the other pump path 106B.

As noted, the optical signal S has a wavelength $\lambda_{In}$, and the pump light $P_{1-2}$ received at the at least one combiner 114 has a wavelength $\lambda_{1Pump}$ and $\lambda_{2Pump}$. The values of $\lambda_{1Pump}$ and $\lambda_{2Pump}$ may be the same or different. Further, the values of $\lambda_{1Pump}$ and $\lambda_{2Pump}$ are selected to provide optical amplification to the optical signal S operating at $\lambda_{In}$ in the presence of a specific rare-earth dopant within the doped fibers 116A-B. The dopant may be erbium, ytterbium, or other dopant, as noted herein.

The pump light $P_{1-2}$ from the laser diode 200 propagates through the fiber core of the doped fiber 116A-B along with the primary signal S to be amplified, and the pump light $P_{1-2}$ provides energy to the active dopant.

When the dopant is Erbium, the wavelength $\lambda_{1Pump}$ or $\lambda_{2Pump}$ of the pump light emitted by the laser 300 may be about 980 nanometers (nm) (e.g., 970 nm to 990 nm), such as a wavelength of 972 nm, 974 nm, 976 nm, or 978 nm. In some embodiments, pump light at the wavelengths $\lambda_{1Pump}$ or $\lambda_{2Pump}$ of about 980 nanometers may be configured to provide amplification in the doped fiber 116A-B to the optical signals S when the wavelengths $\lambda_{In}$ of the optical signals S is about 1550 nm, such as wavelengths in the C band (~1525 nm to 1570 nm), or about 1590 nm, such as wavelengths in the L band (~1570 nm to 1625 nm).

In the reverse pump configuration, the at least one combiner 114 outputs the pump light $P_1$ to the first counter-propagated doped fiber 116A. The pump light $P_1$ at wavelength $\lambda_{1Pump}$ energizes ions in the doped fiber 116A and the optical signal S at wavelength $\lambda_{In}$ interacts with the energized ions. In particular, photons of the optical signal S at the wavelength $\lambda_{In}$ stimulate emission of photons from the energized ions at the wavelength $\lambda_{In}$ to generate at least a portion of the amplified signal $S_A$. As will be appreciated, this portion of the amplified signal $S_A$ passes on through the co-propagated doped fiber 116B to be further amplified.

In the forward pump configuration, the at least one combiner 114 outputs the optical signal S combined with the pump light $P_2$ to the second co-propagated doped fiber 116B. The pump light $P_2$ at wavelength $\lambda_{2Pump}$ energizes ions in the doped fiber 116B and the optical signal S at wavelength $\lambda_{In}$ interacts with the energized ions. In particular, photons of the optical signal S at the wavelength $\lambda_{In}$ stimulate emission of photons from the energized ions at the wavelength $\lambda_{In}$ to generate at least another portion of the amplified signal $S_A$.

After pumping, the amplified signal $S_A$ passes through the second isolator 118 to the output tap 120. The output tap 120 directs a small portion of the amplified signal $S_A$ to the output photodiode 122 to measure optical power of the amplified signal $S_A$. The remainder of the amplified signal $S_A$ passes through the output tap 120 and is output from the fiber amplifier system 500A.

As noted above, the system 500A may include the controller 124 and the laser driver 126. The controller 124 may be communicatively coupled to the input photodiode 110 and the output photodiode 122 to measure the amplification of the input signal S relative to the amplified signal $S_A$. The laser driver 126 may be communicatively coupled to the controller 124 and the laser 300, and the laser driver 126 is generally configured to apply an electrical drive signal to the laser 300 as directed by the controller 124. Optical power of the pump light emitted by the laser 300 may be determined by the electrical drive signal. For example, the laser 300 may emit pump light $P_{1-2}$ with an optical power that is proportional to or has some other known relationship to current of the electrical drive signal.

The controller 124 may compare the optical power of the input signal S (measured by the input photodiode 110) to the optical power of the amplified signal $S_A$ (measured by the output photodiode 122) to determine gain of the fiber amplifier system 500A. If the gain is above or below a target gain, the laser driver 126 may adjust the electrical drive signal to increase or decrease the gain of the fiber amplifier system 500A.

Figure 5B:
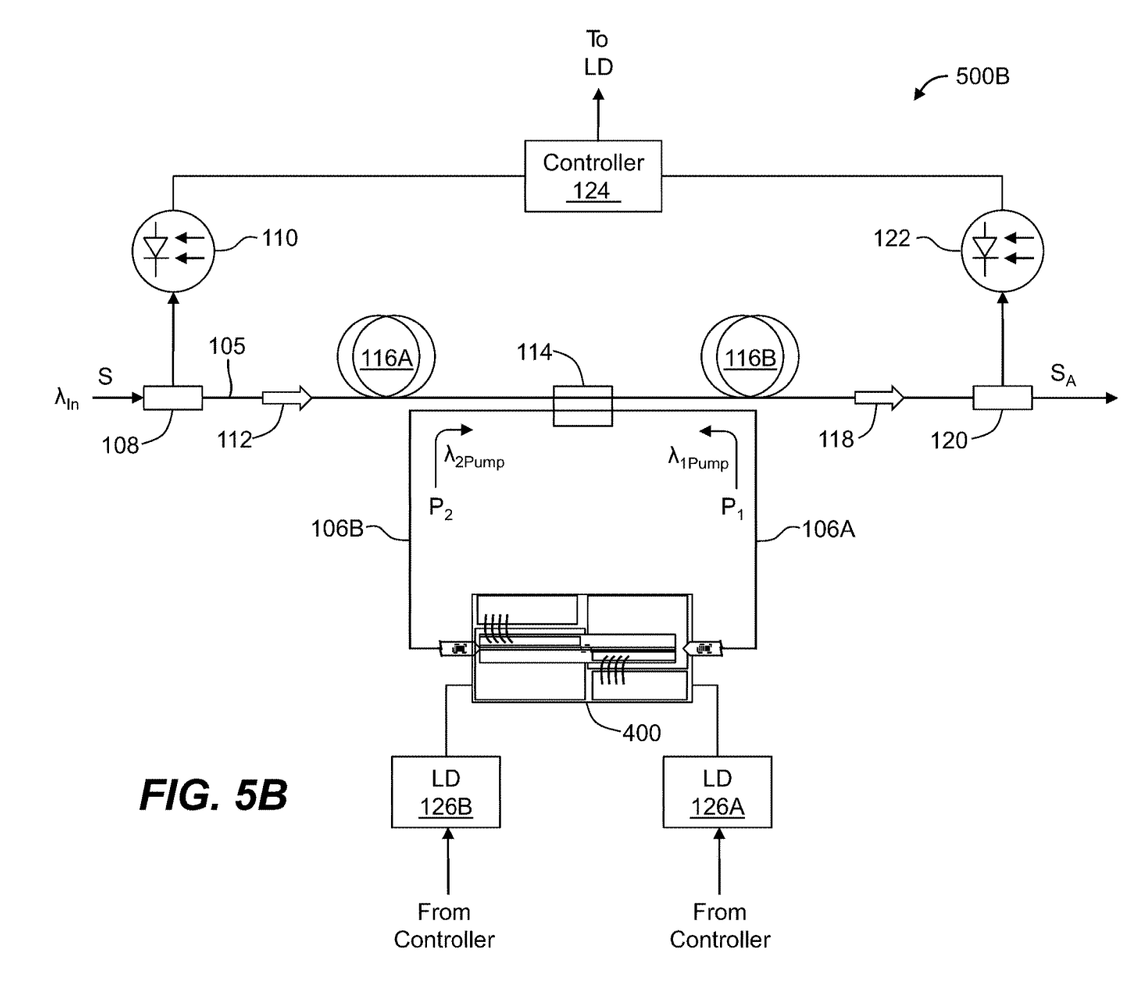
FIG. 5B illustrates a dual fiber amplifier system having another dual output laser diode pumping two doped fibers.

In FIG. 5A, the optical power of the pump light $P_{1-2}$ from the two end facets of the laser 300 may not be independent from the other. In this arrangement, the system 500A may have a single controller 124 and a single laser driver 126. In an alternative embodiment of FIG. 5B, a laser system 500B includes a laser 400 as in FIG. 4 that includes two portions that are independently controlled by corresponding laser drivers 126A-B to independently control gain in the fiber amplifier system 500B. In this example, the optical power of the pump light $P_{1-2}$ from the two end facets of the laser 400 is independently controlled by providing independent electrical drive signals from independent laser drivers 126A-B to independent portions of the laser 400 in accordance with the details disclosed previously.

Figure 6A:
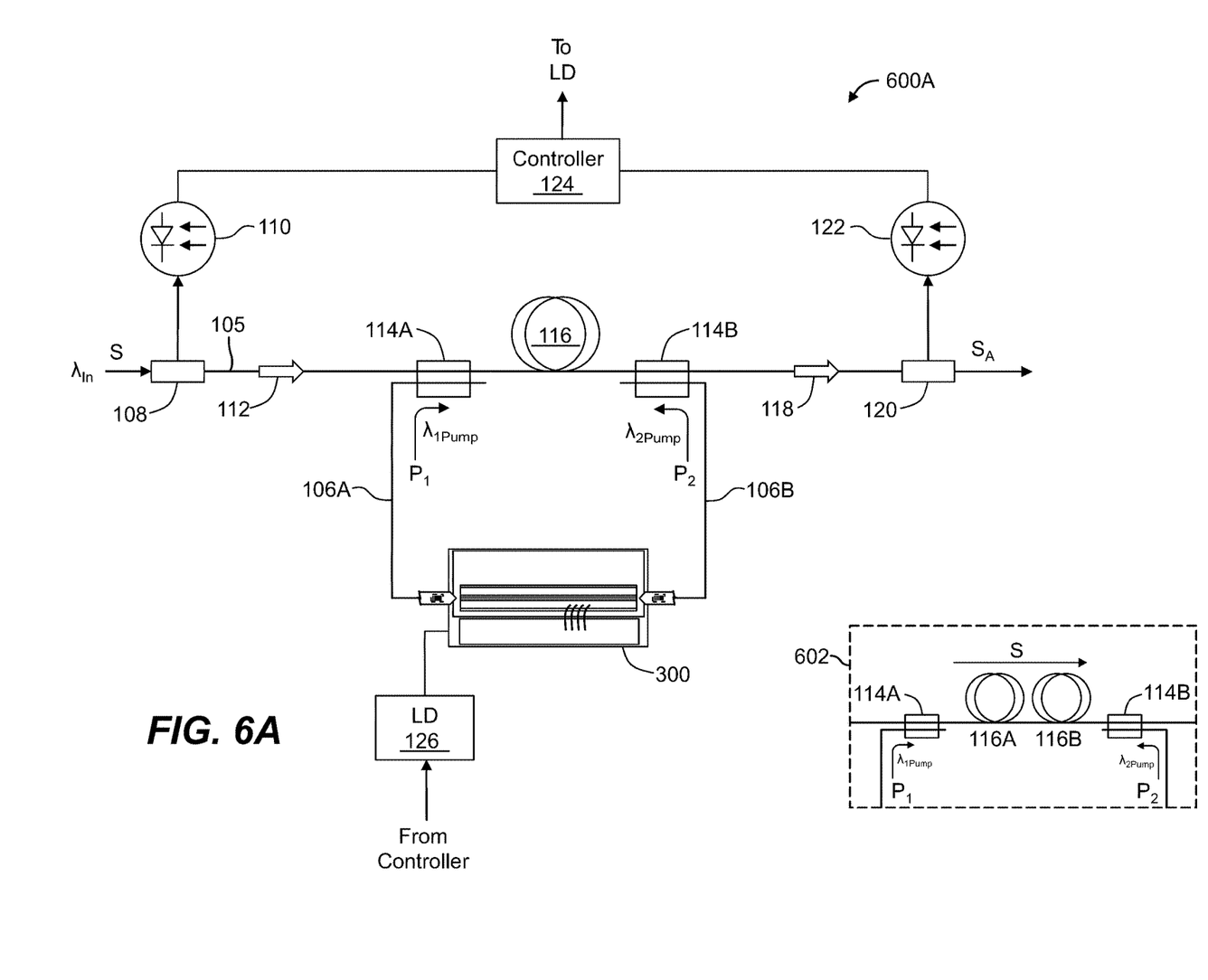
FIG. 6A illustrates a dual fiber amplifier system having a dual output laser diode pumping one doped fiber.

FIG. 6A illustrates another dual fiber amplifier system 600A having a dual output laser diode 300 that pumps the same doped fiber 116 in both forward and reverse pumping. (The same reference numbers are used for comparable elements disclosed in other figures.) The system 600A includes an optical path 105 having a first optical isolator 112, a first beam combiner 114A, a doped fiber 116, a second beam combiner 114, and a second optical isolator 118. As will be appreciated, the optical path 105 may include optical fibers or other suitable waveguides to convey signal light from an input to an output of the system 600A.

As shown, the dual output laser diode 300 has pump paths 106A-B to the respective combiners 114A-B. The pump paths 106A-B may include optical fibers or other suitable waveguides to convey pump light $P_{1-2}$ from the laser diode 300 into the doped fiber 116.

The fiber system 600A is arranged in opposing forward and backward pumping directions relative to a doped fiber 116. The laser 300 pumps first pump light $P_1$ through the first path 106A and the combiner 114A in a forward configuration to the doped fiber 116, and the laser 300 at the same time pumps second pump light $P_2$ through the second path 106B and the combiner 114B in a reverse configuration to the doped fiber 116. Arranged in a forward pumping direction, the first pump light $P_1$ co-propagates with the primary signal light S through the doped fiber 116. The second combiner 114B as a dichroic pump coupler can also prevent any residual pump light from passing on as signal output. Arranged in a backward pumping direction, the second pump light $P_2$ counter-propagates with the primary signal light S through the same doped fiber 116. In general, the optical power of the pump light $P_{1-2}$ can be the same or different; and the pump wavelengths $\lambda_{1-2Pump}$ can be the same or different, due to the versatility of the present configuration and to suite a particular implementation.

Other arrangements can be used. Moreover, the fiber amplifier 500A disclosed herein can be used as part of an amplifier chain in multiple stages. In general, the laser 300 may include the pump laser of FIG. 3 having the two end facets and configured to output pump light $P_{1-2}$ from each of the two end facets into a corresponding one of pump paths 106A-B. For example, an alternative configuration shown in the detail 602 can have the pump light $P_{1-2}$ pumped into more than one doped fiber 116A-B between the combiners 114A-B. If practical, other topologies in line with these examples can be used.

As with other embodiments, the system 600A may also include an input optical tap 108, an input photodiode 110, an output optical tap 120, an output photodiode 122, and a controller 124 for controlling a laser driver 126 of the laser 300.

During operation, an optical signal S is received at the input tap 108, and a small portion thereof (e.g., 2%) can be directed by the input tap 108 to the input photodiode 110 to measure optical power of the optical signal S. A remainder (e.g., 98%) of the optical signal S passes through the input tap 108 and the first isolator 112 and then passes to the first combiner 114A, the doped fiber 116, and the second combiner 114B. The first isolator 112 may be configured to prevent or at least reduce back reflection from the combiner 114A.

In the forward pump configuration, the combiner 114A combines the optical signal S with the pump light $P_1$ received from the laser 300 via the pump path 106A. The pump light $P_1$ at wavelength $\lambda_{1Pump}$ energizes ions in the doped fiber 116 and the optical signal S at wavelength $\lambda_{In}$ interacts with the energized ions. In the reverse pump configuration, the combiner 114B combines the optical signal S with the pump light $P_2$ received from the laser 300 via the other pump path 106B to the doped fiber 116. The pump light $P_2$ at wavelength $\lambda_{2Pump}$ energizes ions in the doped fiber 116B and the optical signal S at wavelength $\lambda_{In}$ interacts with the energized ions.

After pumping, the amplified signal $S_A$ passes through the second isolator 118 to the output tap 120. The output tap 120 directs a small portion of the amplified signal $S_A$ to the output photodiode 122 to measure optical power of the amplified signal $S_A$. The remainder of the amplified signal $S_A$ passes through the output tap 120 and is output from the fiber amplifier system 100B.

As noted above, the system 600A may include the controller 124 and the laser driver 126. The controller 124 may be communicatively coupled to the input photodiode 110 and the output photodiode 122 to measure the amplification of the input signal S to $S_A$. The laser driver 126 may be communicatively coupled to the controller 124 and the laser 300, and the laser driver 126 is generally configured to apply an electrical drive signal to the laser 300 as directed by the controller 124. Optical power of the pump light $P_{1-2}$ emitted by the laser 300 may be determined by the electrical drive signal. For example, the laser 300 may emit pump light with an optical power that is proportional to or has some other known relationship to current of the electrical drive signal.

The controller 124 may compare the optical power of the input signal S (measured by the input photodiode 110) to the optical power of the amplified signal $S_A$ (measured by the output photodiode 122) to determine gain of the fiber amplifier system 600A. If the gain is above or below a target gain, the laser driver 126 may adjust the electrical drive signal to increase or decrease the gain of the fiber amplifier system 600A.

Figure 6B:
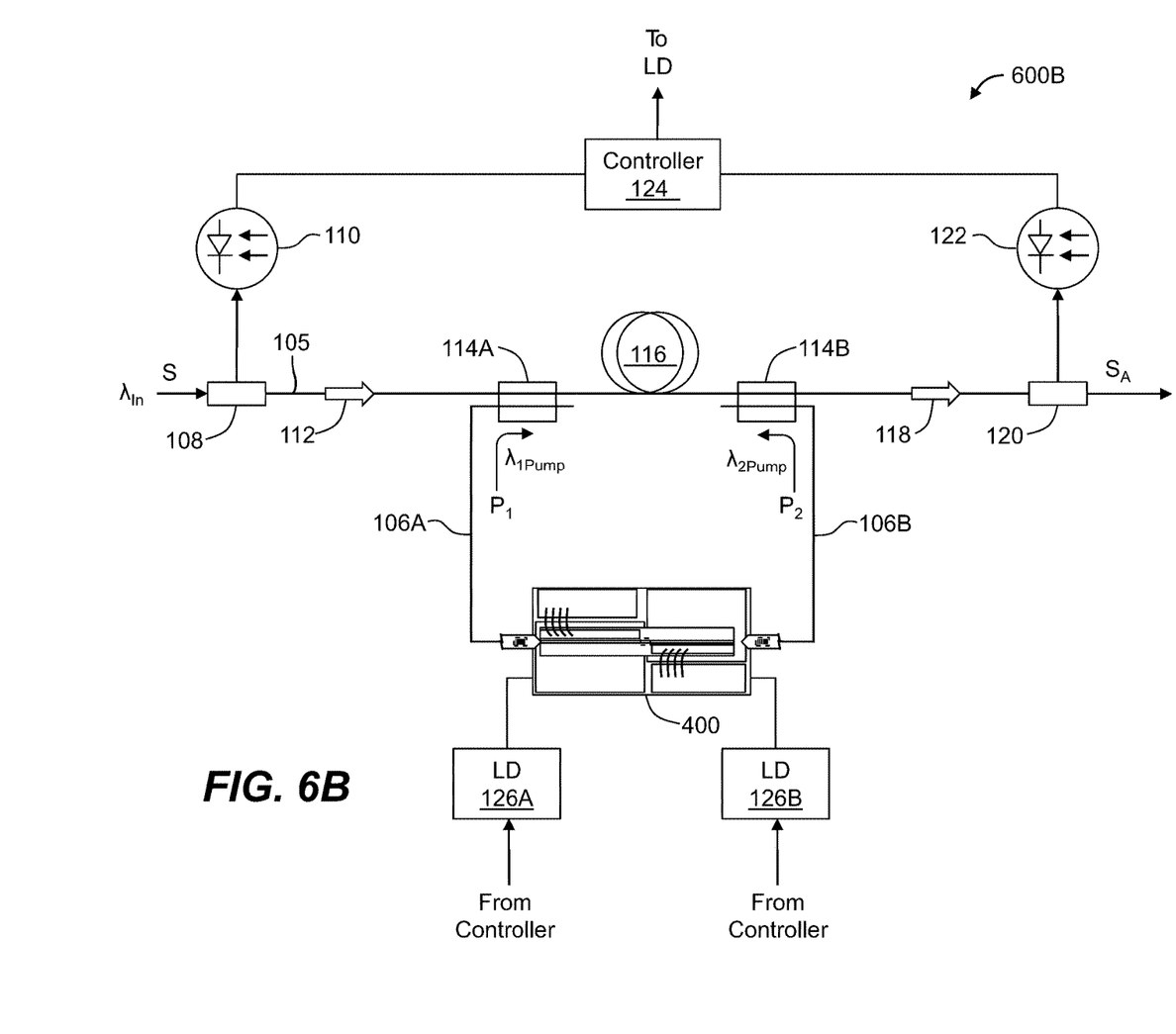
FIG. 6B illustrates a dual fiber amplifier system having another dual output laser diode pumping one doped fiber.

In FIG. 6A, the optical power of the pump light $P_{1-2}$ from the two end facets of the laser 300 may not be independent from the other. In this arrangement, the system 600A may have a single controller 124 and a single laser driver 126. In an alternative embodiment of FIG. 6B, a laser system 600B includes a laser 400 as in FIG. 4 that includes two portions that are independently controlled by a corresponding laser drivers 126A-B to independently control gain in the fiber amplifier system 600B. In this example, the optical power of the pump light $P_{1-2}$ from the two end facets of the laser 400 is independently controlled by providing independent electrical drive signals from independent laser drivers 126A-B to independent portions of the laser 400 in accordance with the details disclosed previously.

An example method to operate a dual output laser diode or a dual fiber amplifier system will now be described. The dual output laser diode may include any of the lasers 102, 200, 300, 400 or other lasers described herein. The dual fiber amplifier system may include the system 100A or other dual fiber amplifier systems described herein.

The method may include injecting an electrical drive signal into an active section of a dual output laser diode, the active section positioned between a first end facet and a second end facet of the dual output laser diode. Injecting the electrical drive signal into the active section may include injecting a single electrical drive signal into the active section, e.g., via the anode 216, 310 and cathode 214, 308 of FIGS. 2-3.

Alternatively or additionally, injecting the electrical drive signal into the active section may include injecting a first electrical drive signal into a first portion of the active section, e.g., the first portion 412 of FIG. 4 via the first anode and cathode 416, 418, and injecting a second electrical drive signal into a second portion of the active section, e.g., the second portion 414 of FIG. 4 via the second anode and cathode 420, 422. The first portion of the active section may be optically isolated from the second portion of the active section, e.g., by a reflective structure such as the reflective structure 410 of FIG. 4.

The method may include generating light in the active section of the dual output laser diode responsive to injection of the electrical drive signal.

The method may include propagating the light toward each of the first and second end facets. In particular, some of the generated light may be propagated toward the first end facet and some of the generated light may be propagated toward the second end facet.

The method may include transmitting a majority of the light that reaches the first end facet through the first end facet. Transmitting the majority of the light that reaches the first end facet through the first end facet may include transmitting at least 99% of the light that reaches the first end facet through the first end facet.

The method may include transmitting a majority of the light that reaches the second end facet through the second end facet. Transmitting the majority of light that reaches the second end facet through the second end facet may include transmitting at least 99% of the light that reaches the second end facet through the second end facet.

In some embodiments, the method may also include coupling light transmitted through the first end facet into a first pump input optical fiber of a first fiber amplifier and coupling light transmitted through the second end facet into a second pump input optical fiber of a second fiber amplifier. The method may further include operating each of the first and second fiber amplifiers, e.g., as described with respect to FIG. 1A.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

What is claimed is:

1. A fiber amplifier operable with at least one electric drive signal for amplifying signal light on an optical path, the signal light having a signal wavelength, the fiber amplifier comprising:
    a laser diode having an active section positioned between first and second end facets, the active section being configured to generate first and second pump light that propagates respectively toward the first and second end facets in response to injection of the electrical drive signal into the active section, the first and second pump light having at least one pump wavelength different from the signal wavelength; and
    at least one doped fiber disposed on the optical path and being doped with an active dopant, the at least one doped fiber having the signal light and at least a portion of the first and second pump light propagated therethrough, the at least one pump wavelength of the first and second pump light being configured to interact with the active dopant of the at least one doped fiber and thereby amplify the signal light,
    wherein the first end facet comprises a first reflectivity at least at the at least one pump wavelength; wherein the second end facet comprises a second reflectivity at least at the at least one pump wavelength; and wherein the first reflectivity is different from the second reflectivity.

2. The fiber amplifier of claim 1, comprising at least one fiber Bragg grating (FBG) configured to lock at least one of the first and second pump light from at least one of the first and second end facets to the at least one pump wavelength.

3. The fiber amplifier of claim 1, the signal wavelength being in a 1550-nm range, wherein the at least one pump wavelength is in a 980-nm and/or 1480-nm range; and
    wherein the dopant of the fiber comprises Erbium.

4. The fiber amplifier of claim 1, wherein the first pump light co-propagates through the at least one doped fiber; and wherein the second pump light counter-propagates through the same at least one doped fiber.

5. The fiber amplifier of claim 4, comprising more than one of the at least one doped fiber disposed between the first and second combiners.

6. A fiber amplifier operable with at least one electric drive signal for amplifying signal light on an optical path, the signal light having a signal wavelength, the fiber amplifier comprising:
    a laser diode having an active section positioned between first and second end facets, the active section being configured to generate first and second pump light that propagates respectively toward the first and second end facets in response to injection of the electrical drive signal into the active section, the first and second pump light having at least one pump wavelength different from the signal wavelength; and
    at least one doped fiber disposed on the optical path and being doped with an active dopant, the at least one doped fiber having the signal light and at least a portion of the first and second pump light propagated therethrough, the at least one pump wavelength of the first and second pump light being configured to interact with the active dopant of the at least one doped fiber and thereby amplify the signal light, wherein:

the active section comprises a waveguide extending between the first and second end facets;

a first portion of the waveguide near the first end facet has a first transmissivity at least at the at least one pump wavelength;

a second portion of the waveguide near the second end facet has a second transmissivity at least at the at least one pump wavelength; and the first transmissivity is different from the second transmissivity.

7. A fiber amplifier operable with at least one electric drive signal for amplifying signal light on an optical path, the signal light having a signal wavelength, the fiber amplifier comprising:

a laser diode having an active section positioned between first and second end facets, the active section being configured to generate first and second pump light that propagates respectively toward the first and second end facets in response to injection of the electrical drive signal into the active section, the first and second pump light having at least one pump wavelength different from the signal wavelength; and at least one doped fiber disposed on the optical path and being doped with an active dopant, the at least one doped fiber having the signal light and at least a portion of the first and second pump light propagated therethrough, the at least one pump wavelength of the first and second pump light being configured to interact with the active dopant of the at least one doped fiber and thereby amplify the signal light, wherein the active section of the laser diode further comprises a reflective structure formed in the active section between first and second portions of the active section, the reflective structure configured to at least partially isolate optical communication of the first and second pump light from one of the first and second portions to the other.

8. The fiber amplifier of claim 7, wherein the first end facet comprises a first reflectivity at least at the at least one pump wavelength; wherein the second end facet comprises a second reflectivity at least at the at least one pump wavelength; and wherein the first reflectivity is different from the second reflectivity.

9. A fiber amplifier operable with at least one electric drive signal for amplifying signal light on an optical path, the signal light having a signal wavelength, the fiber amplifier comprising:

a laser diode having an active section positioned between first and second end facets, the active section being configured to generate first and second pump light that propagates respectively toward the first and second end facets in response to injection of the electrical drive signal into the active section, the first and second pump light having at least one pump wavelength different from the signal wavelength; and at least one doped fiber disposed on the optical path and being doped with an active dopant, the at least one doped fiber having the signal light and at least a portion of the first and second pump light propagated therethrough, the at least one pump wavelength of the first and second pump light being configured to interact with the active dopant of the at least one doped fiber and thereby amplify the signal light, the signal light having a first signal light portion with a first of the signal wavelength and having a second signal light portion with a second of the signal wavelength, wherein the at least one doped fiber comprises:

a first of the at least one doped fiber disposed on a first of the optical path and being doped with a first of the active dopant, the first doped fiber having the first signal light portion and the first pump light propagated therethrough; and a second of the at least one doped fiber disposed on a second of the optical path and being doped with a second of the active dopant, the second doped fiber having the second signal light portion and the second pump light propagated therethrough.

10. The fiber amplifier of claim 9, comprising:

a first combiner disposed on the first optical path and being configured to combine the first pump light on the first optical path; and a second combiner disposed on the second optical path and being configured to combine the second pump light on the second optical path.

11. The fiber amplifier of claim 10, wherein the first pump light is different from the second pump light; wherein a first of the at least one pump wavelength of the first pump light is different from a second of the at least one pump wavelength of the second pump light; wherein the first doped fiber is different from the second doped fiber; or wherein the first active dopant is different from the second active dopant.

12. A fiber amplifier operable with at least one electric drive signal for amplifying signal light on an optical path, the signal light having a signal wavelength, the fiber amplifier comprising:

a laser diode having an active section positioned between first and second end facets, the active section being configured to generate first and second pump light that propagates respectively toward the first and second end facets in response to injection of the electrical drive signal into the active section, the first and second pump light having at least one pump wavelength different from the signal wavelength; and at least one doped fiber disposed on the optical path and being doped with an active dopant, the at least one doped fiber having the signal light and at least a portion of the first and second pump light propagated therethrough, the at least one pump wavelength of the first and second pump light being configured to interact with the active dopant of the at least one doped fiber and thereby amplify the signal light, wherein the at least one doped fiber comprises:

a first of the at least one doped fiber disposed on the optical path and being doped with a first of the active dopant, the first doped fiber having the signal light propagated therethrough and having the first pump light counter-propagated therethrough; and a second of the at least one doped fiber disposed on the optical path and being doped with a second of the active dopant, the second doped fiber having the signal light propagated therethrough and having the second pump light co-propagated therethrough.

13. The fiber amplifier of claim 12, further comprising at least one combiner configured to combine the first and second pump light on the optical path.

14. The fiber amplifier of claim 13, wherein the at least one combiner comprises:

a first of the at least one combiner disposed on the optical path between the first and second doped fibers and being configured to combine the first pump light on the optical path; and a second of the at least one combiner disposed between the first doped fiber and the first combiner and being configured to combine the second pump light on the optical path.

15. The fiber amplifier of claim 12, wherein the first pump light is different from the second pump light; wherein a first of the at least one pump wavelength of the first pump light is different from a second of the at least one pump wavelength of the second pump light; wherein the first doped fiber is different from the second doped fiber; or wherein the first active dopant is different from the second active dopant.

16. The fiber amplifier of claim 15, comprising:

a first combiner disposed on the optical path upstream of the at least one doped fiber and being configured to combine the first pump light on the optical path; and a second combiner disposed one the optical path downstream of the at least one doped fiber and being configured to combine t the second pump light on the optical path.

17. A method used with signal light having a signal wavelength, the method comprising:

passing the signal light through at least one doped fiber disposed on an optical path and being doped with an active dopant;

injecting an electrical drive signal into an active section of a dual output laser diode, the active section positioned between first and second end facets of the dual output laser diode;

generating first and second pump light that propagates respectively toward the first and second end facets in response to the injection of the electrical drive signal into the active section, the first and second pump light having at least one pump wavelength different from the signal wavelength; and amplifying the signal light by:

propagating the first pump light from the first end facet relative to the signal light passing through the at least one doped fiber and interacting the first pump light with the at least one doped fiber; and propagating the second pump light from the second end facet relative to the signal light passing through the at least one doped fiber and interacting the second pump light with the at least one doped fiber, the signal light having a first signal light portion with a first of the signal wavelength and having a second signal light portion with a second of the signal wavelength, wherein amplifying the signal light comprises:

propagating the first pump light from the first end facet with the first signal light portion passing through a first of the at least one doped fiber on a first of the optical path and interacting the first pump light with the first doped fiber; and propagating the second pump light from the second end facet with the second signal light portion passing through a second of the at least one doped fiber on a second of the optical path and interacting the second pump light with the doped fiber.

18. A method used with signal light having a signal wavelength, the method comprising:

passing the signal light through at least one doped fiber disposed on an optical path and being doped with an active dopant;

injecting an electrical drive signal into an active section of a dual output laser diode, the active section positioned between first and second end facets of the dual output laser diode;

generating first and second pump light that propagates respectively toward the first and second end facets in response to the injection of the electrical drive signal into the active section, the first and second pump light having at least one pump wavelength different from the signal wavelength; and amplifying the signal light by:

propagating the first pump light from the first end facet relative to the signal light passing through the at least one doped fiber and interacting the first pump light with the at least one doped fiber; and propagating the second pump light from the second end facet relative to the signal light passing through the at least one doped fiber and interacting the second pump light with the at least one doped fiber, wherein amplifying the signal light comprises:

counter-propagating the first pump light from the first end facet relative to the signal light passing through a first of the at least one doped fiber on the optical path and interacting the first pump light with the first doped fiber; and co-propagating the second pump light from the second end facet with the signal light passing through a second of the at least one doped fiber on the same optical path and interacting the second pump light with the second doped fiber.

19. The method of claim 17, wherein amplifying the signal light comprises:

co-propagating the first pump light from the first end facet with the signal light passing through the at least one doped fiber on the optical path and interacting the first pump light with the at least one doped fiber; and counter-propagating the second pump light from the second end facet with the signal light passing through the at least one doped fiber on the same optical path and interacting the second pump light with the at least one doped fiber.

20. The method of claim 18, the signal light having a first signal light portion with a first of the signal wavelength and having a second signal light portion with a second of the signal wavelength, wherein amplifying the signal light comprises:

propagating the first pump light from the first end facet with the first signal light portion passing through a first of the at least one doped fiber on a first of the optical path and interacting the first pump light with the first doped fiber; and propagating the second pump light from the second end facet with the second signal light portion passing through a second of the at least one doped fiber on a second of the optical path and interacting the second pump light with the doped fiber.

* * * * *